United States Patent [19]
Fletcher et al.

[11] 3,938,188
[45] Feb. 10, 1976

[54] ANALOG TO DIGITAL CONVERTER

[76] Inventors: James C. Fletcher, Administrator of the National Aeronautics and Space Administration, with respect to an invention of Charles H. Lucas, Glendora, Calif.

[22] Filed: Aug. 27, 1974

[21] Appl. No.: 501,011

[52] U.S. Cl. .......................................... 340/347 AD
[51] Int. Cl.² ...................................... H03K 13/06
[58] Field of Search ............... 340/347 CC, 347 AD; 324/99 D, 130

[56] References Cited
UNITED STATES PATENTS
3,588,881 6/1971 Gordon ...................... 340/347 AD
3,641,563 2/1972 Cushman ................... 340/347 AD

*Primary Examiner*—Charles D. Miller
*Attorney, Agent, or Firm*—Monte F. Mott; Paul F. McCaul; John R. Manning

[57] ABSTRACT

An analog-to-digital converter, finding particular application in a multichannel pulse height analyzer, includes means for digitizing the analog input in two conversion steps. To digitize the input to 13 bits, a 7-bit digital to analog converter (DAC) with a 7-bit up-down counter is used. During the first conversion step which is a coarse conversion, the input, $V_I$, is compared with the DAC output, $V_L$ and the 7-bits of the counter are set by successive approximation. Thereafter, after settling, the DAC output is driven twice toward $V_I$. The output of an amplifier of a gain $2^7$ is stored after each change of the DAC in one of two storage and hold circuits, depending on the polarity of the amplifier output. Then, the content of the 7-bit counter is transferred to the 7 higher order bits of a 14-bit buffer counter. Then, the fine conversion step is performed by successive approximation. In it the voltage in one of the storage and hold circuits is applied as the input and the difference of the voltages in the two storage and hold circuits is applied to a resistor ladder of the DAC. Then, the 7 bits of the counter are transferred to the 7 lower bits of the buffer counter. Thereafter, it is incremented by one and truncated by one, so that only its 13 higher order bits are read out, as the 13 bit output.

20 Claims, 6 Drawing Figures

| B.P. | GENERAL OPERATION | EXAMPLE |
|---|---|---|
| 1 | DETERMINE STATE OF B1 | B1 REMAINS AT 1 |
| 2 | " " " B2 | B2 RETURN TO 0 |
| 3 | " " " B3 | B3 REMAINS AT 1 |
| 4 | " " " B4 | B4 RETURN TO 0 |
| 5 | " " " B5 | B5 REMAINS AT 1 |
| 6 | " " " B6 | B6 REMAINS AT 1 |
| 7 | " " " B7 | B7 RETURN TO 0, NO ACTIVITY |
| 8 | SETTLE | |
| 9 | SETTLE & STEP 34 TOWARD $V_I$ | B7 SWITCHED TO 1 |
| 10 ⎫ <br> ⋮ ⎬ <br> ⋮ ⎭ | SETTLE & LOAD ONE OF S.H. | ASSUMING $V_I < V_L$, LOAD S.H.2 WITH A1 OUTPUT |
| 29 | STEP TOWARD $V_I$ | B7 SWITCHED TO 0 ($V_I > V_L$) |
| 30 ⎫ <br> ⋮ ⎬ <br> ⋮ ⎭ | SETTLE | |
| 39 | LOAD ONE OF S.H. | LOAD S.H.1 WITH A1 OUTPUT & LOAD C1-C7 WITH B1-B7 |
| 40 ⎫ <br> 41 ⎬ <br> 42 ⎭ | RESET SWITCHES | RESET SW1 & SW2 TO OTHER POSITIONS |
| 43 | DETERMINE STATE OF B8 | B1 DRIVEN & REMAINS AT 1 |
| 44 | " " " B9 | B2 " " " " 1 |
| 45 | " " " B10 | B3 " " " " 1 |
| 46 | " " " B11 | B4 DRIVEN TO 1, RETURNED TO 0 |
| 47 | " " " B12 | B5 DRIVEN & REMAINS AT 1 |
| 48 | " " " B13 | B6 " " " " 1 |
| 49 | " " " B14 | B7 DRIVEN TO 1, RETURNED TO 0 |
| 50 ⎫ <br> 51 ⎬ | SETTLE | |
| 52 | STEP DOWN ONLY IF $V_{SH1} < V_L$ | |
| 53 | LOAD C8-C14 | B1-B7 LOADED IN C8-C14 |
| 54 | INCREMENT COUNTER 40 | COUNT IN COUNTER 40 INCREASED BY 1 TO 10101101101011 |
| 55 | SETTLE | |
| 56 | READ OUT C1-C13 INTO OUTPUT UNIT AS 10101101101011 | |

ANALOG TO DIGITAL CONVERTER

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

1. Field of the Invention:

The present application relates to analog to digital conversion and more particularly, to an analog to digital converter, which though not limited to, finds particular application in a pulse height analyzer.

2. Description of the Prior Art:

In the field of spectroscopy as well as in other scientific studies produced pulses which represent various phenomena such as energy levels are analyzed to learn about the phenomena represented by the pulses. For example, a high spectral resolution spectrometer produces many pulses of different heights. These are typically analyzed in a multichannel pulse height analyzer, wherein the pulses are digitized as a function of their detected peaks. Each channel is associated with a different digital output. It effectively stores a count or number, indicating the number of pulses which were digitized during the period and produced the particular digital output associated with the channel. In such an application, it is of prime importance to include an analog to digital converter (ADC), whose digital outputs when counted in the different channels results in equal width channels. Variations in channel widths with respect to the average width is generally referred to as differential linearity. Differential linearity is very important since differences in channel widths can cause the appearance of false peaks and mislocation of true peaks in mislocated channels.

Differential linearity is related to the desired digital resolution. In a successive approximation type ADC in which an N bit resistive ladder is included to digitize the pulses into N-bit numbers, the % differential linearity is equal to the % resistor matching tolerance in the ladder times $2^N$. For 13-bit resolution, i.e., N=13. Even with a resistance matching tolerance of 0.005%, the % differential linearity is about 41%. Such high differential linearity is too high for many accurate studies.

Another important property of an ADC in a pulse height analyzer is stability due to the relatively long period during which data, i.e., pulses are received. Also good integral linearity is important, in order to be able to relate the phenomena, e.g., energy represented by the digitized peaks to the energy represented by calibrated peaks.

Some pulse height analyzers with ADC's of up to 13 bits, are at present, available commercially. They are represented as having very good differential linearity. However, their stability is not sufficiently high for certain applications. Also, they do not seem to be easily modifiable to provide resolution beyond 13 bits. Thus, a need exists for a new ADC which exhibits the above described properties, including good differential linearity.

OBJECTS AND SUMMARY OF THE INVENTION

It is a primary object of the present invention to provide a new analog to digital converter.

A further object of the present invention is to provide an analog to digital converter exhibiting good differential linearity over a wide range of channels.

These and other objects of the invention are achieved by providing an N-bit ADC in which both interpolation between coarse conversion levels, incrementation and final truncation of the output takes place. The invention will be described for explanatory purposes only in connection with a 13-bit ADC. The converter includes a 7-resistor ladder network and a 14-bit register. In the ADC a full conversion is performed in two conversion steps, with the same ladder being used in each step, which is of the successive approximation type. In the first step a coarse conversion is performed and the 7 higher order bits of the register are set to their appropriate states. In the first step, a reference voltage is applied to the ladder network whose output is compared with the analog input. In the second step signals derived in the first conversion step are used to determine the states for the 7 least significant bits of the register. After the second step, the register is incremented by 1 and only its 13 highest order bits are read out as the ADC's 13-bit output.

The novel features of the invention are set forth with particularity in the appended claims. The invention will best be understood from the following description when read in conjunction with the accompanying drawings.

DESCRIPTION OF THE PREFERRED EMBODIMENTS

Figure 1:
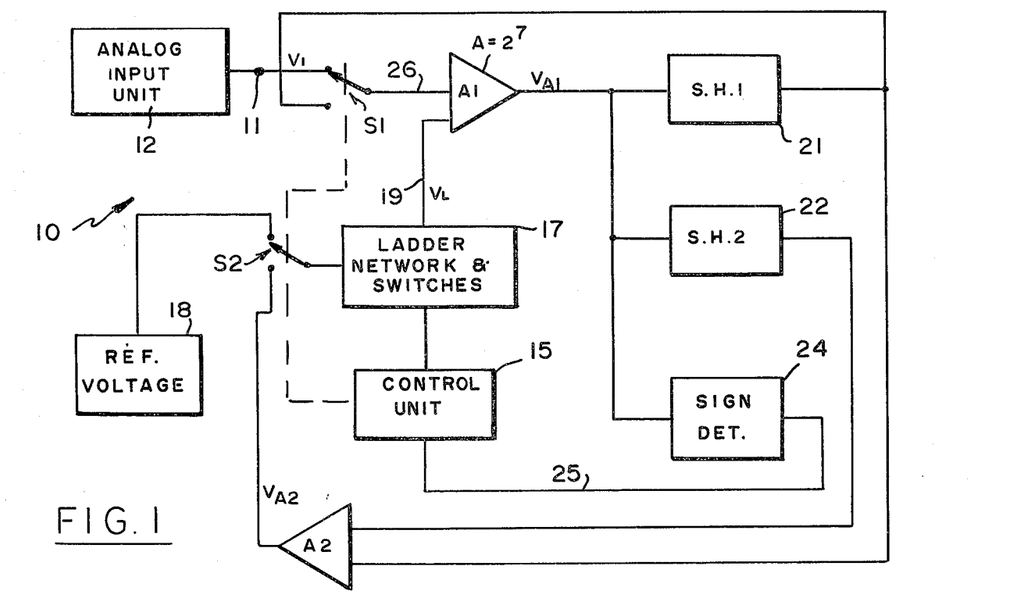
FIG. 1 is a block diagram of one embodiment of the invention.

Attention is first directed to FIG. 1 wherein one embodiment of the novel ADC is designated generally by numeral 10. Its input terminal 11 is shown connected to an analog input unit 12 which provides the analog input, e.g., an input voltage to be digitized. The ADC 10 includes a control unit 15 which in essence controls the ADC's operations. At the start of each conversion of the input voltage to a digital number unit 15 activates unit 12 which includes a storage and hold circuit to hold the input voltage, hereinafter designated as $V_I$, substantially constant at terminal 11 while the conversion operation takes place. As will be pointed out hereinafter, the full conversion is performed in two steps. The input voltage at terminal 11 need be stable only during the first step in which a coarse conversion is performed.

During the first step a first switch, designated S1 and represented as a mechanical switch for explanatory purposes only, is controlled by control unit 15 to be in the position as shown. Thus, the input voltage at terminal 11 is applied through switch S1 to one input of a differential amplifier A1. The other input to amplifier A1 is from a ladder network 17, to which a reference voltage from a source 18 is applied during the first step through a switch S2, which is under the control of control unit 15. The ladder network voltage is designated $V_L$ and is applied to A1 via line 19.

As shown in FIG. 1, the ADC 10 includes a storage and hold unit 21, hereinafter also referred to SH1, another storage and hold unit 22, hereinafter also referred to as SH2, and a sign detector 24. The latter detects the polarity of the output of A1, designated $V_{A1}$, and applies a control signal to control unit 15 via line 25. For explanatory purposes, it is assumed that when $V_I > V_L$ the output of A1, i.e., $V_{A1}$, is positive and the output of detector 24 is high and when $V_I > V_L$, $V_{A1}$ is negative and the detector 24 output is low. Amplifier A1 amplifies the difference between $V_I$ and $V_L$ by a factor which depends on the number of bits which are to be resolved in the conversion step.

The ADC also includes a differential amplifier A2 which provides an output $V_{A2}$, which is the difference of the voltages in SH1 and SH2. The gain of A2 is assumed to be 1. In step 2, control unit 15 controls S1 and S2 to respectively supply the voltage in SH1 designated $V_{SH1}$ to A1 and $V_{A2}$ to network 17.

The novelty of the ADC and its manner of operation may best be described with a specific example in which it is assumed that $V_I$ is to be digitized into a 13-bit number, (N=13). In the present invention, the control unit 15 and the network 17 during the first step resolve $V_I$ to a resolution of 7 bits which effectively represent the 7 higher order bits of the desired 13-bit number. These 7 bits are transferred to the 7 higher order bits of a 14-bit buffer up counter. The difference between $V_I$ and $V_L$ represented by these seven higher bits amplified by A1 by a factor of $2^7$ is stored in SH1. During the second step it is resolved into 7 bits which are transferred to the 7 lower order bits of the 14 bit buffer counter. Then the latter is incremented by one and its 13 higher order bits represent the desired output number.

Figure 2:
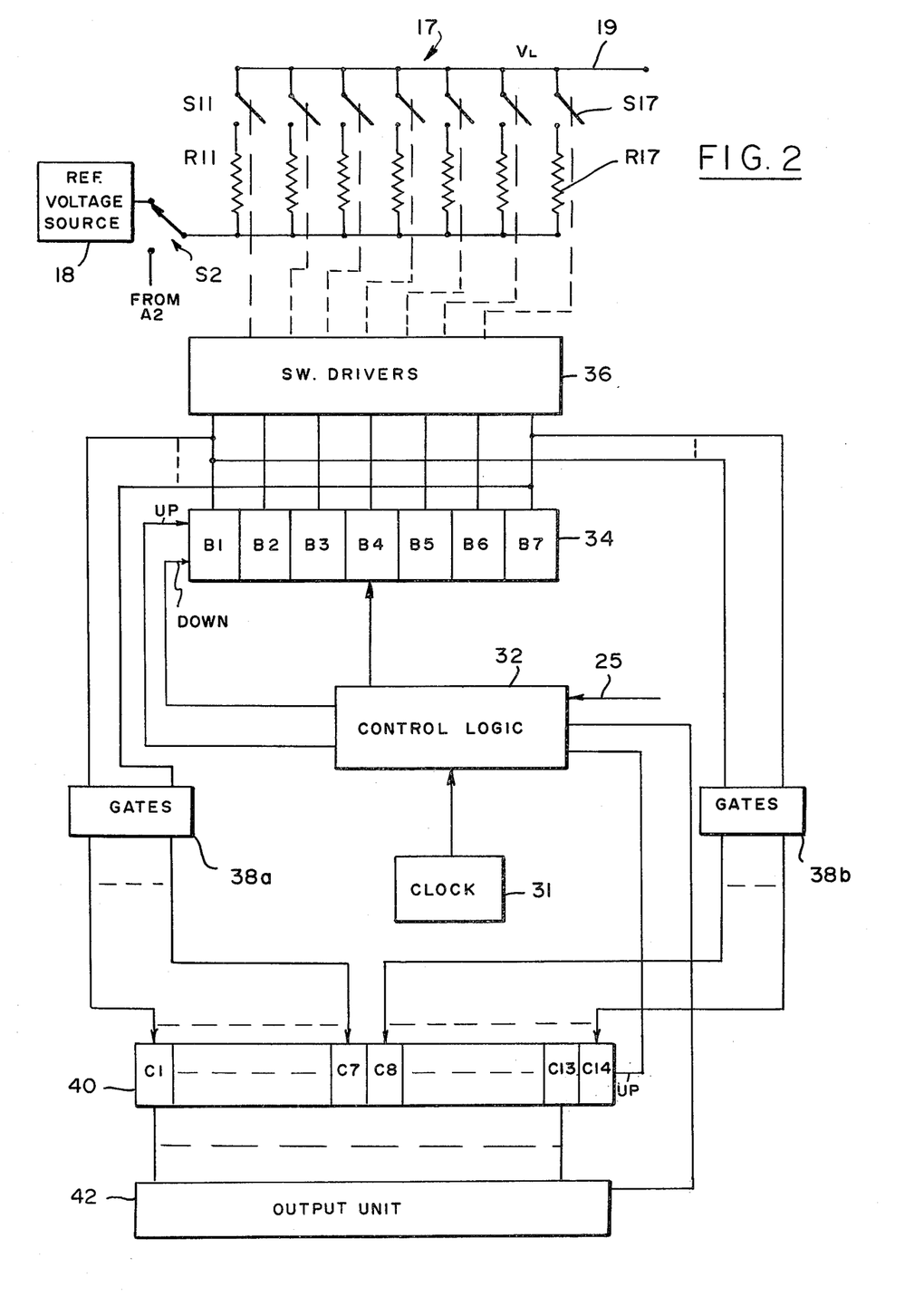
FIG. 2 is a detailed diagram of the control unit ladder network shown in FIG. 1.

Attention is now directed to FIG. 2 wherein the control unit 15 and the ladder network 17 are shown in greater detail for the exemplified embodiment. The ladder network 17 is shown consisting of seven resistors R11–R17 and seven switches S11–S17. The control unit 15 is shown including a clock 31 which clocks control logic 32 which in turn controls the states of the bits B1–B7 of a 7-bit up-down working counter 34. Switch drivers 36 are also included. They control switches S11–S17 as a function of the states of B1–B7, respectively. For explanatory purposes, it is assumed that when a counter bit is in a binary 1 state, the switch which it controls is closed, thereby increasing the ladder output voltage $V_L$ in line 19.

The determination of the state of each bit is performed during a different clock or bit period (BP) from clock 31. Also shown are control gates 38a which control the transfer of the states of B1–B7 to stages or bits C1–C7 of a 14-bit up counter, hereinafter referred to as buffer counter 40. Similarly, gates 38b control the transfer of B1–B7 to stages C8-C14 of buffer counter 40. The latter is also connected to control logic 32 which at an appropriate time increments buffer counter 40 by one. Logic 32 further activates an output unit 42 to recieve C1–C13 as the 13-bit output number.

In the example, it is assumed that $V_I$ is to be resolved into a 13-bit number (N=13) where each bit or count represents less than 1 mv and that $V_I$ maximum is not more than 10v less about 78 mv, for reasons to be explained hereinafter.

In accordance with the present invention, $V_I$ is first resolved to a resolution of 7 bits, and thereafter the difference between $V_I$ and a voltage corresponding to 7 higher order bits is again resolved to 7 bits for a total resolution of 14 bits. These are then incremented by one and truncated by one for a final 13-bit resolution. With a reference voltage $V_R$ of 10v the embodiment is capable of digitizing $V_I$ up to a maximum amplitude of $(10 - 10/2^7)$ volts. The resistors R11-R17 are chosen so that $V_L$ is 5 volts, i.e., $\frac{1}{2}V_R$ when only S11 is closed, 2.5v ($\frac{1}{4}V_R$) when only S12 is closed, etc. Thus, $V_L$ depends on which of switches S11–S17 are closed, which is in turn controlled by the states of B1–B7. The states of B1–B7 are controlled during each conversion step by successive approximation.

During the first step the states of B1–B7 are successively determined by successive approximation. After this approximation the count (represented by the combined states of B1–B7) in counter 34 is stepped twice, each time by one, so that $V_L$ changes toward $V_I$. After the stepping operation, if $V_I > V_L$, $V_{A1}$ is loaded in SH2. Then after the second stepping operation $V_{A1}$ is loaded in SH1 and B1–B7 are transferred to C1–C7. Then during the next step $V_{A2}$ is supplied via switch S2 to network 17 and $V_{SH1}$ is compared with $V_L$ and counter 34 is again set by successive approximation. At the end of the second successive approximation, B1–B7 are transferred to C8–C14. Then, buffer counter is incremented by one, and its bits C1–C13 are transferred to unit 42 as the 13-bit output number.

Figure 3:
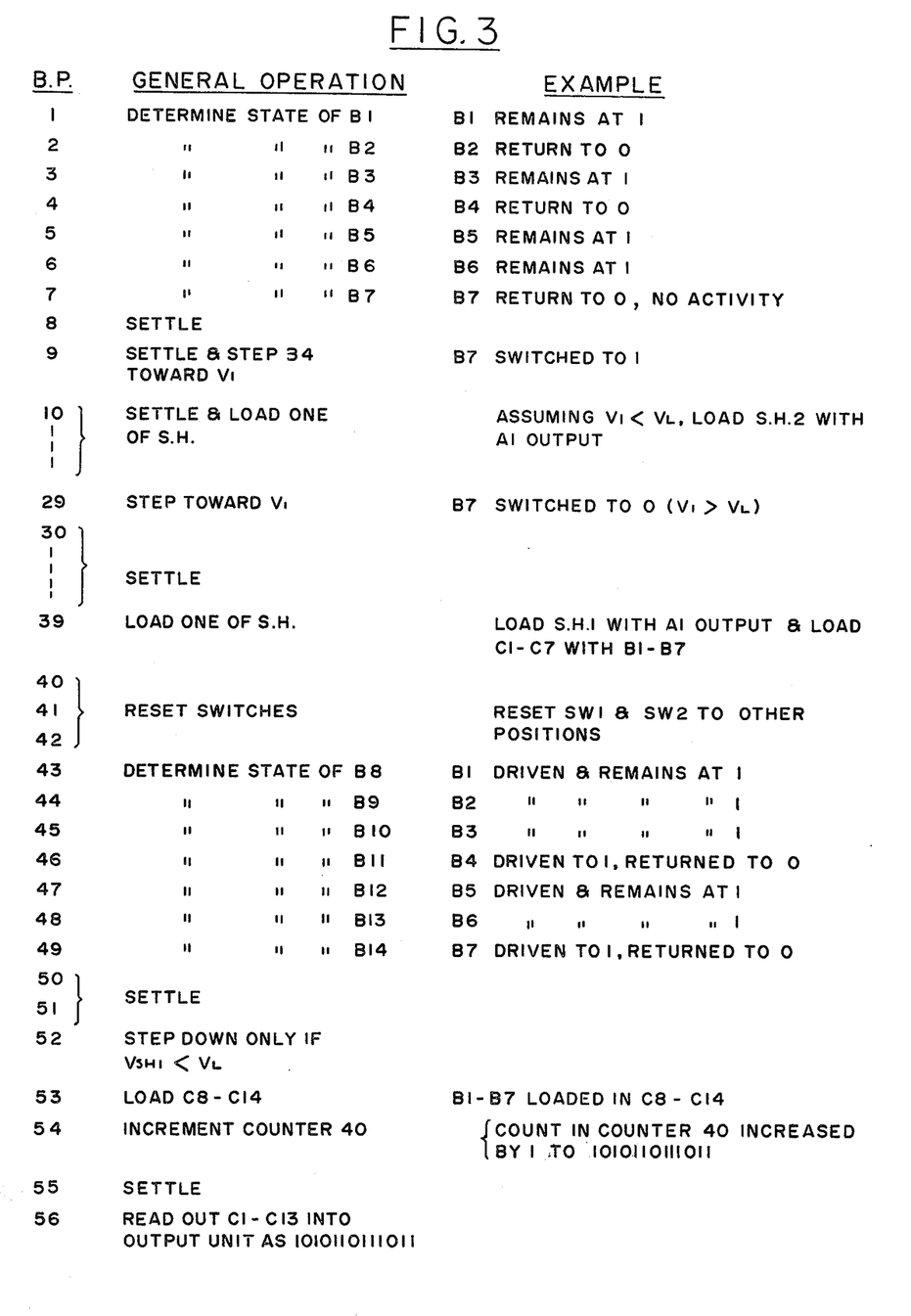
FIG. 3 is a table useful in explaining the operation of the embodiment of FIG. 1.

Attention is now directed to FIG. 3 which is useful in further explaining the present invention. The conversion operation begins with the first bit period, designated BP1 in which the state of B1 is determined. As in all successive approximation, it is set to a 1. If $V_L$ exceeds $V_I$ it is returned to a 0. If, however, $V_L < V_I$, it remains a 1 and switch S11 remains closed. Then the operation is repeated for each of the other bits (B2–B7). Let it be assumed that $V_I$ is such that after BP7 bits, B1, B3, B5 and B6 are 1's and B2, B4 and B7 are 0's. The next two bit periods BP8 and BP9 are used to permit the circuitry to settle down. At the end of BP9, the counter 34 is stepped toward $V_I$. Assuming that at the end of BP9, $V_I > V_L$, counter 34 is incremented by 1. Thus, in the particular example, at the end of BP9, B1–B7 are at states 1010111. The next 20 bit periods BP10–BP28 are used to enable the circuitry to settle down. At BP 28, $V_{A1}$ is loaded in one of the storage and hold units. Assuming that at BP28, $V_I < V_L$, $V_{A1}$ is negative and the detector 24 output is low, $V_{A1}$ is loaded in SH2. Then during BP29 the register 24 is again stepped in the direction of $V_I$. Since $V_L > V_I$, the register 34 is decremented by one to 1010110. BP30–BP38, i.e., the next 9 bit periods are used to enable the circuitry to settle down. At BP39, $V_{A1}$ is loaded in the other SH unit. Since previously SH2 was loaded, at BP39, SH1 is loaded with $V_{A1}$. When SH1 is loaded, the content of register 34, i.e., B1–B7 is transferred in parallel to the seven most significant bits C1–C7 of a buffer counter 40.

At this point in the operation the first coarse conversion step is completed. Three bit periods BP40–BP42 are used to switch switches S1 and S2 to the second step position and B1–B7 may be reset to all zero. Then, in the following seven bit periods, BP43–BP49, part of the second conversion step is performed. In it, bits B1–B7 are again driven to their appropriate states, based on successive approximation, as previously described. It should be stressed however, that in this step A1 compares $V_L$ not with $V_I$ but rather with the voltage in SH1, designated $V_{SH1}$. Also, the reference voltage to the ladder is the output of A2, designated $V_{A2}$, where $V_{A2} = V_{SH1} - V_{SH2}$.

During BP50 and BP51 the circuitry is permitted to settle down. Thereafter, during BP52, if $V_L > V_{SH1}$ the counter 34 is decremented. However, if $V_{SH1} > V_L$ counter 34 is not altered. Then, during BP53 bits B1–B7 are transferred in parallel to C8–C14, respectively.

For all practical purposes, the conversion operation is complete. In accordance with the present invention instead of reading out the 14 bits of counter 40, the counter 40 is first incremented by one during BP54 and thereafter it is truncated so that only the 13 most significant bits of it are read out as the ADC's digital output. In the foregoing example, assuming that C1–C14 after B1–B7 are transferred to C8–C14 at BP53, counter 40 is 10101101100110, when incremented by one, the number in it is 10101101110111. However, after truncation, it is 1010110111011. If, however, the number at the end of BP53 is 1010110111011, after incrementing, it becomes 10101101111000. Therefore, after truncating the least significant bit (LSB), the 13-bit number in counter 40 is 1010110111100.

If desired instead of using an up-counter, such as counter 40, it can be implemented as a 14-bit shift register. After BP53, that is, after all its 14 bits are set, it can be clocked out, LSB first, through an adder to add a count of one, and read out all the bits serially except the LSB. In such an embodiment the read out is serially rather than in parallel.

From the foregoing, it is thus seen that in this embodiment of the ADC 10 of the present invention conversion is performed in 2 steps. To convert the analog input into 13 (N=13) bits the ladder network of N+1/2 = 13+1/2 = 7 resistors are employed twice. During the first step $V_I$ is used and is compared with the ladder output $V_L$, to which a reference voltage from source 18 is applied. Successive approximation techniques are used to set the seven stages of the working counter 34. After all the seven stages are set the counter is stepped by one to change the ladder output, $V_L$ toward the input voltage $V_I$.

If after the successive approximation, $V_I > V_L$, the working counter is incremented by one to increase $V_L$. On the other hand, if $V_I < V_L$, the working counter is decremented by one to decrease $V_L$. After the first stepping of the working counter, if $V_I > V_L$, $V_{A1}$ is loaded in SH1 and the contents of the seven stages of the working counter, i.e., B1–B7, are loaded into the seven higher order stages (C1–C7) of a buffer counter. On the other hand, if after the first stepping of the working counter $V_I < V_L$, $V_{A1}$ is loaded in SH2.

Then, the working counter is stepped again toward $V_I$. It is incremented by 1 to increase $V_L$ if $V_I > V_L$ or is decremented by one if $V_I < V_L$. After the second stepping $V_{A1}$ is loaded into the other SH which was not loaded after the first stepping operation. When SH1 is loaded, B1–B7 are transferred to C1–C7.

Then, the second conversion step is performed. In it, instead of the reference voltage from source 18, the amplified difference between the voltages is SH1 and SH2, i.e., $V_{A2}$ is applied to the ladder network and the voltage in SH1, rather than $V_I$, is compared with the ladder output $V_L$ in setting, by successive approximation, the seven bits B1–B7 of the working counter.

After setting these bits and if $V_L > V_{SH1}$, the seven bits are decremented by one and then they are transferred to the seven lower order bits of the buffer counter. Then the latter is incremented by one and thereafter truncated, by reading out all the bits therefrom except the LSB.

It should be pointed out that $V_{A2}$, i.e., the difference between $V_{SH1}$ and $V_{SH2}$ is nominally one count of the working counter which with a reference voltage of 10v is equal to $10/2^7 = 78$ mv times the gain of $2^7$ of A1 or 10v. $V_{SH1}$ actually represents the difference between $V_I$ and the voltage already represented in the seven higher order bits C1–C7 of counter 40 times $2^7$. It has been discovered that such analog to digital conversion exhibits excellent differential, as well as, integral linearity and stability even for higher order bit resolution, such as 13 bits. These properties are particularly important in pulse height analyzers such as those used in spectrographic analysis.

By using the difference between the voltages in SH1 and SH2, i.e., $V_{SH1}$ and $V_{SH2}$ as represented by the output of A2, i.e., $V_{A2}$ as the reference voltage for the second conversion step the effect of the ladder offsets are greatly reduced. Also, the fact that the digitization is actually performed for a resolution greater than the desired final resolution and by truncating the last bit, the converter's performance is greatly improved.

Although the invention has been described in connection with a 13-bit ADC it is clear that it can be practiced to produce ADC's with other bit resolutions. For example, for a 15-bit ADC an eight-resistor ladder network may be used. Counter 34 would be 8 bits long, and counter 40 would be 16 bits long, which after incrementation by one, would be truncated by one to produce a 15-bit output. In each step an 8-bit resolution will be performed. Thus, the gain of A1 should be $2^8$.

From the foregoing, it should be apparent that the input voltage $V_I$ is only applied during the first or coarse conversion step. To expedite the rate of the ADC's operation, i.e., increase the number of inputs digitizable per second, the control logic 32, after the first step, e.g., at BP40 may reset the analog input unit 12 to load and hold another input voltage which will be used during the first step of the next conversion.

Figure 4:
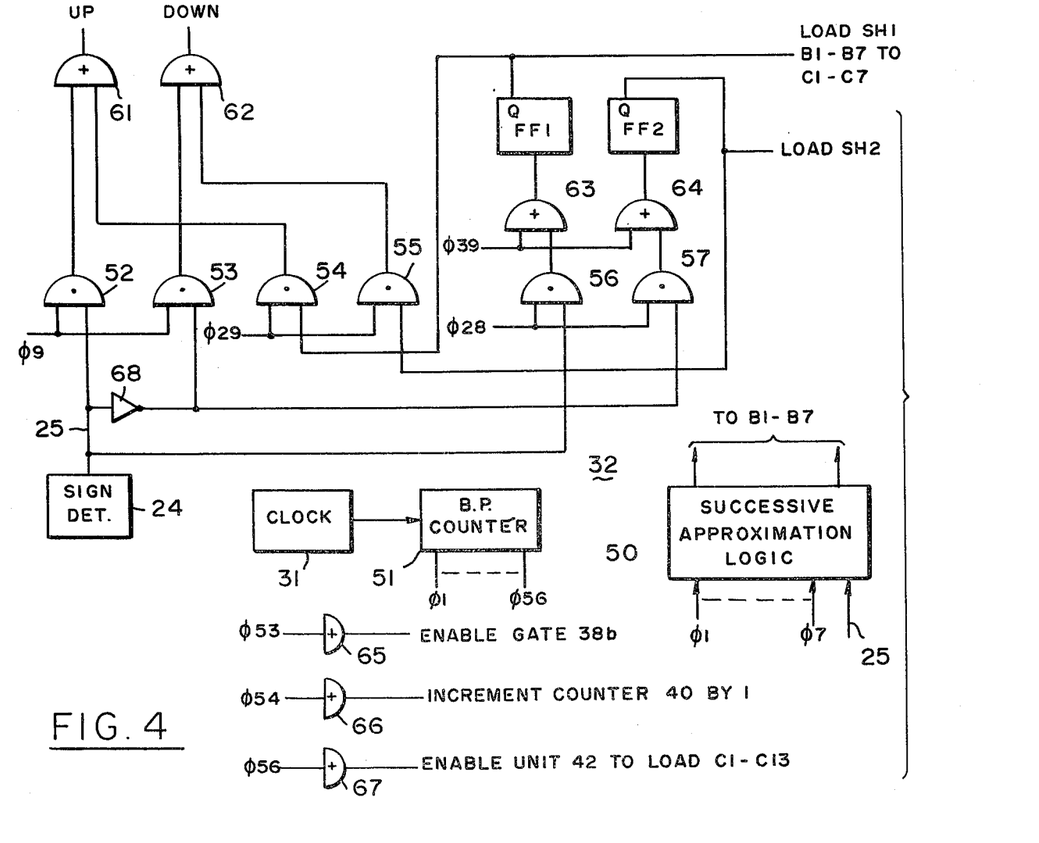
FIG. 4 is a logic diagram of control logic, shown in FIG. 2.

Before proceeding to describe other embodiments of the present invention, reference is made to FIG. 4 which is a logic diagram of one possible implementation of the control logic 32. It should however by appreciated that the control logic 32 may be implemented differently, then as shown, in order to perform the operations, hereinbefore described. Briefly, the control logic 32 includes a bit period (BP) counter 51 which is clocked by the clock 31. The outputs of counter 51 designated as $\phi 1-\phi 56$ define the various bit periods of corresponding numbers. Output $\phi 1$ is high during bit period 1, $\phi 2$ is high during bit period 2, etc. Logic 32 further includes six And gates 52 through 57, seven Or gates 61–67, two flip flops FF1 and FF2 and an inverter 68.

As connected, during BP9, $\phi 9$ is high. Therefore, if the output of the sign detector 24 on line 25 is high, thereby indicating that $V_I$ is greater than $V_L$, And gate 52 is enabled and through Or gate 61 produces an up pulse to the working counter 34 which increments it by 1. On the other hand, if during BP9, the output of sign detector 24 on line 25 is low, thereby indicating $V_L$ is greater than $V_I$, the output of inverter 68 is high.

Therefore, And gate 53 is enabled, in turn enabling Or gate 62 to decrement (DOWN) the working counter by 1.

During BP28 one of the storage and hold units is to be loaded. If at that time line 25 is high, thereby indicating that $V_I > V_L$, And gate 56 is enabled which in turn enables gate 63, thereby setting flip flop FF1. When the latter is set its Q output is high thereby enabling SH1 to be loaded with $V_{A1}$. At the same time, gates 38a are enabled to cause the states of bits B1–B7 to be loaded in bits C1–C7 of the buffer counter 40.

On the other hand, if during BP28 line 25 is low, thereby indicating that $V_L > V_I$, And gate 57 is enabled, thereby enabling Or gate 64 to set flip flop FF2. When the latter is set, its Q output goes high and SH2 is loaded with the output of A1. During bit period 29 a second stepping of the working counter takes place. If, previously, FF1 was set, And gate 54 is enabled to thereby increment the working counter through Or gate 61. However, if during bit period 28 FF2 was set, then during bit period 29 And gate 55 is enabled which in turn enables Or gate 62 to decrement the working counter 34 by 1. During bit period 39, the other storage and hold unit which was not previously loaded is being loaded. This is achieved by enabling both gates 63 and 64 to set their associated flip flops. Thus, the previously unset or reset flip flop is set during bit period 39 thereby controlling the loading of the storage and hold unit with which it is associated.

During bit period 53, B1–B7 of the working counter 34 have to be transferred to bits C8–C14 of the buffer counter 40. This is achieved by enabling gate 65 to enable gates 38b to facilitate the bit state transfer. During bit period 54 Or gate 66 is enabled to increment the count of the buffer counter 40 by 1, and during bit period 56 an enabling signal is supplied via gate 67 to the output unit 42 to receive the states of bits C1–C13 of the buffer counter.

The control logic 32 also includes successive approximation logic 50 of the type which receives $\phi1-\phi7$ and line 25 to successively set B1–B7 during the first conversion step. It may also receive $\phi43-\phi49$ to successively set B1–B7 during the second conversion step. On the other hand, separate successive approximation logic may be used for the second step. It should be pointed out that after the first successive approximation if $V_L > V_I$, such as at BP9, the counter 34 has to be incremented by 1. If, however, it is already at a full count, i.e., B1–B7 are all 1's the logic 32 sends a signal to the output unit that the conversion cannot be performed. This may be indicated by setting all the 13 bits of the output unit 42 to all 1's.

Figure 5:
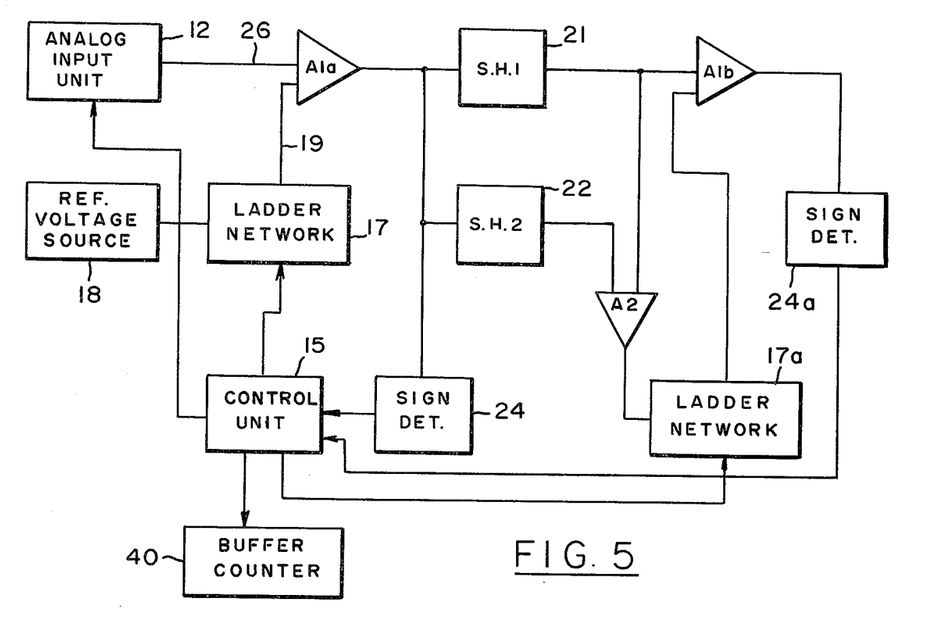
FIGS. 5 and 6 are block diagrams of different embodiments of the invention.

In the foregoing described embodiment, the same ladder network 17 is used during each of the conversion steps. If desired, a separate 7-resistor (for 13-bit output) may be used so that the first step of one conversion may take place while the second conversion step is taking place for the preceding conversion. Such an embodiment is shown in FIG. 5. In this embodiment, the switches S1 and S2 are eliminated. Network 17 is directly connected to source 18 and an amplifier A1a, which performs the functions of A1 for the first conversion step, is connected directly to input unit 12. This embodiment includes an additional amplifier A1b which compares the output of SH1 with the output of a second ladder network 17a. The reference voltage to the latter is the output of A2. The output of A1b is supplied to a second sign detector 24a, whose output is fed to the control unit 15. The latter includes the arrangement as shown in FIG. 2. However, in addition it includes a separate 7-bit register which is used to control the switches in network 17a, as a function of the output of detector 24a. Thus, in such an embodiment working counter 34 is used to control network 17 and load C1–C7 of counter 40, while the seven bits of the separate register are used to control network 17a and are later used to load C8–C14 of the buffer counter. Thus, in this embodiment after the completion of the first step of a conversion the second step can be performed with network 17a, while the first step of the next conversion is performable by network 17 and the related circuitry.

The networks 17 and 17a are not limited to 7-resistors each. For example to convert the input voltage to 16-bit resolution the input voltage may be resolved in the first step to 9 bits, and in the second step 8 bits for a total of 9+8=17 bits, which after incrementation and truncation of the buffer counter 40 results in a 16-bit output. In such a case, A1a provides an amplification of $2^9$ since in the first step the resolution is to 9 bits. In general, to provide N-bit resolution, the first step can be used to resolve the first B bits, the next step to resolve the lower C bits where B+C=N+D. D represents the number of bits to be truncated. In the foregoing examples D=1. However, it need not be limited thereto and may be more than 1. In such a general embodiment the nominal gain of A1a should be $2^B$.

It should also be pointed out that the teaching of the invention can be adapted to produce the desired conversion is more than 2 steps to provide higher bit resolution, or more efficient use of parts. For example, 3 steps may be employed with the arrangement shown in FIG. 6 to provide a 20-bit resolution. Ladder network 17 is assumed to be of 7 bits as shown in FIG. 2. In this embodiment switch S1 is a 3-position switch, two more storage and hold units SH3 and SH4 are added and two 2-position switches S3 and S4. The buffer counter 40 is 21 bits long.

Figure 6:
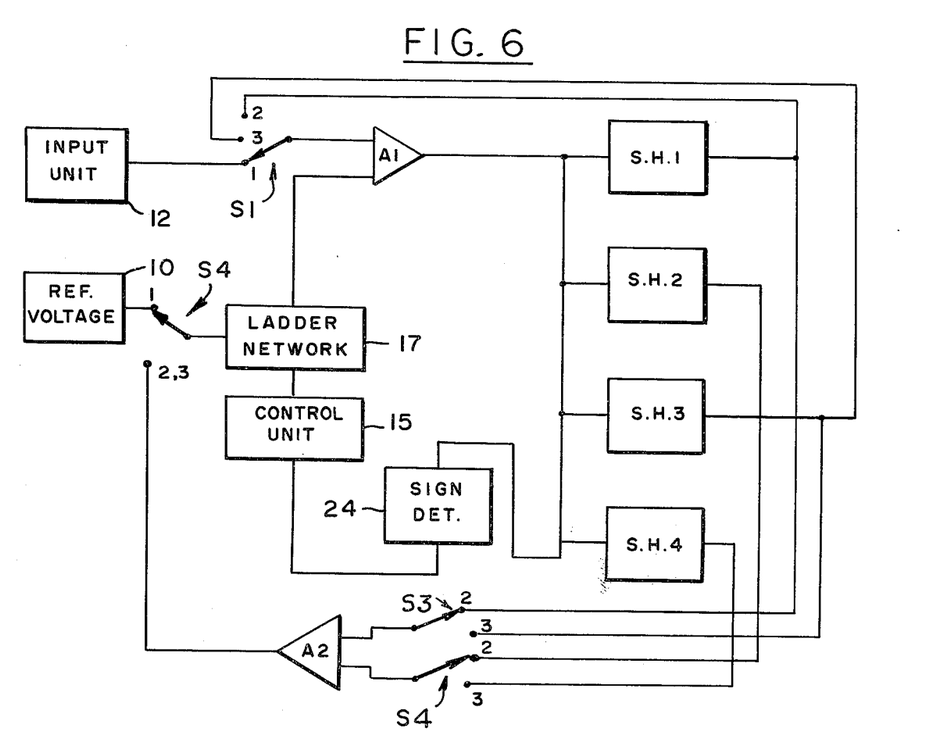

The conversion operation is as follows:

1. The first step is as hereinbefore described. Thus, at the end of the first step C1–C8 of the buffer counter 40 are loaded.

2. At the end of the second step SH3 and SH4 are loaded in a manner similar to that performed for SH1 and SH2 at the end of the first step. During step 2, all switches are in position 2, and the step similar to that before described for step 2 is performed. At the end of step 2, C9–C14 are loaded with B1–B7.

3. To perform step 3, all switches are switched to position 3 and step 3 is performed as step 2 previously described. At the end of step 3, C15–C21 are loaded with B1–B7.

4. Buffer counter 40 is incremented by 1 and truncated to read out only C1–C20, i.e., only 20 bits.

It should be pointed out that in this arrangement during step 3, $V_{SH3}$ is supplied to A1 via S1 and $V_{SH3}$ and $V_{SH4}$ are supplied to A2 to produce the reference voltage. Since in each step each bit represents $2^7$ bits of the next step the gain of A1 is $2^7$. It should be apparent that instead of performing the 3 steps in sequence the steps may be performed in parallel by employing a 3-stage embodiment similar to the 2-stage arrangement shown in FIG. 5. It should be apparent that in any of the embodiments the gain of A1 (or A1a, A1b) is one which depends on the number of bits represented by one bit of the preceding conversion step.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. An analog to digital converter for digitizing an analog input voltage to an N-bit digital number where N is an integer, comprising:
   input means for receiving the input voltage to be digitized;
   an amplifier for providing an output voltage which is a function of the difference between first and second voltages applied thereto, amplified by a factor $2^B$ where B is an integer greater than one;
   a sign detector connected to said amplifier for providing first and second signals when the amplifier output voltage is of first and second polarities, respectively, said amplifier output being of said first polarity when said first voltage is not less than said second voltage and of said second polarity when said first voltage is less than said second voltage;
   control means for defining first and second conversion steps;
   first and second voltage storage means coupled to said amplifier and selectively actuatable to store the output voltage thereof;
   a source of reference potential;
   digital-to-analog converter means including a B-bit up-down counter coupled to said control means and to said sign detector, for applying said second voltage to said amplifier as a function of the states of said B bits of said counter;
   means for applying said reference potential to said digital-to-analog means during said first step;
   means for applying said input voltage to said amplifier as said first voltage during said first step;
   first successive approximation means coupled to said sign detector, said control means and said up-down counter for successively approximating the states of said B bits during a first portion of said first step as a function of the signals from said sign detector;
   means for stepping the count in said counter by one during each of second and third portions of said first step following said first portion so as to decrease the difference between said first and second voltages, and for storing the amplifier output after said second portion in either said first storage means or said second storage means when said amplifier output voltage is either of said first polarity or said second polarity, respectively, and for storing the amplifier output voltage in the other storage means after the third portion of said first step; and
   buffer means of at least B+C bits, for receiving in the first higher order B bits thereof the states of the B bits of said working counter, B+C being not less than N.

2. The converter as described in claim 1 wherein B=C and B+C = B+B = N+D, said converter further including means for applying the voltage in said first storage means to said amplifier as said first voltage during said second step and for applying to said digital to analog converter means a reference potential during said second step which is a function of the difference between the voltages in said first and second storage means, and second means for successively approximating the states of the B bits of said counter during a first portion of said second step as a function of the signals of said sign decoder, and means for transferring the states of said B bits of said counter to bits B+1 through B+B of said buffer means, D being an integer, not less than 1.

3. The converter as described in claim 2 further including means for incrementing the binary count in said buffer by one following said second step, and means for receiving the states of the B+B−D higher order bits of said buffer means.

4. The converter as described in claim 3 wherein B = N+D/2.

5. The converter as described in claim 4 wherein D=1 and N is odd.

6. The converter as described in claim 1 further including a second digital to analog converter means including a C-bit register for generating a voltage as a function of said C bits of said register, means for applying the difference between the voltage in said first and second storage means to said second digital to analog conversion means during said second step, means for successively approximating the states of said C bits during a first portion of said second step, and means for transferring the states of said C bits to bits B+1 to B+C of said buffer means during a second portion of said second step.

7. The converter as described in claim 6 wherein B+C = N+D, and further including means for incrementing the count in said buffer means by one after said second portion of said second step, and means for reading out the N higher order bits of said buffer means.

8. The converter as described in claim 7 wherein the difference between B and C is not greater than one.

9. The converter as described in claim 7 wherein D=1.

10. The converter as described in claim 7 wherein B=C.

11. The converter as described in claim 1 wherein said means for stepping include means for respectively incrementing or decrementing the count in said counter by one during said second portion of said first step when the amplifier output voltage is of said first polarity or said second polarity, respectively, means for storing the amplifier output voltage in said first storage means or said second storage means after said second portion and before said third portion when the amplifier output voltage is of said first polarity or said second polarity, respectively, means for respectively incrementing or decrementing the count in said counter by one during said third portion if said amplifer output voltage was previously stored in said first or said second storage means, respectively, and means for storing the amplifier output voltage following said third portion in the storage means in which said amplifier output voltage was not stored as yet.

12. The converter as described in claim 11 wherein B=C and B+C = B+B = N+D, said converter further including means for applying the voltage in said first storage means to said amplifier as said first voltage during said second step and for applying to said digital to analog converter means a reference potential during said second step which is a function of the difference between the voltages in said first and second storage means, and second means for successively approximating the states of the B bits of said counter during a first portion of said second step as a function of the signals of said sign decoder, and means for transferring the states of said B bits of said counter to bits B+1 through B+B of said buffer means, D being an integer, not less than 1.

13. The converter as described in claim 12 further including means for incrementing the binary count in said buffer by one, following said second step and means for receiving the states of the B+B−D higher order bits of said buffer means.

14. The converter as described in claim 13 wherein B = N+D/2.

15. The converter as described in claim 14 wherein D=1 and N is odd.

16. The converter as described in claim 15 further including a second digital to analog converter means including a C-bit register for generating a voltage as a function of said C bits of said register, means for applying the difference between the voltage in said first and second storage means to said second digital to analog conversion means during said second step, means for successively approximating the states of said C bits during a first portion of said second step, and means for transferring the states of said C bits to bits B+1 to B+C of said buffer means during a second portion of said second step.

17. The converter as described in claim 16 wherein B+C = N+D, and further including means for incrementing the count in said buffer means by one after said second portion of said second step, and means for reading out the N higher order bits of said buffer means.

18. The converter as described in claim 17 wherein the difference between B and C is not greater than one.

19. The converter as described in claim 17 wherein D=1.

20. The converter as described in claim 17 wherein B=C.

* * * * *